United States Patent
Endoh et al.

(10) Patent No.: US 10,328,534 B2
(45) Date of Patent: *Jun. 25, 2019

(54) BONDING MATERIAL AND BONDING METHOD USING SAME

(71) Applicant: DOWA ELECTRONICS MATERIALS CO., LTD., Tokyo (JP)

(72) Inventors: Keiichi Endoh, Okayama (JP); Minami Nagaoka, Okayama (JP); Satoru Kurita, Okayama (JP); Hiromasa Miyoshi, Okayama (JP); Yoshiko Kohno, Okayama (JP); Akihiro Miyazawa, Okayama (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 502 days.

This patent is subject to a terminal disclaimer.

(21) Appl. No.: 14/899,858

(22) PCT Filed: Jun. 19, 2014

(86) PCT No.: PCT/JP2014/066916
§ 371 (c)(1),
(2) Date: Dec. 18, 2015

(87) PCT Pub. No.: WO2014/204013
PCT Pub. Date: Dec. 24, 2014

(65) Prior Publication Data
US 2016/0136763 A1 May 19, 2016

(30) Foreign Application Priority Data
Jun. 21, 2013 (JP) .................. 2013-130849

(51) Int. Cl.
| | |
|---|---|
| B22F 1/00 | (2006.01) |
| B22F 7/06 | (2006.01) |
| B23K 35/30 | (2006.01) |
| B23K 1/00 | (2006.01) |
| B23K 35/02 | (2006.01) |
| H05K 3/34 | (2006.01) |

(52) U.S. Cl.
CPC ........ *B23K 35/3006* (2013.01); *B22F 1/0014* (2013.01); *B22F 1/0018* (2013.01); *B22F 1/0022* (2013.01); *B22F 1/0062* (2013.01); *B22F 1/0074* (2013.01); *B23K 1/0008* (2013.01); *B23K 35/025* (2013.01); *B22F 7/064* (2013.01); *B22F 2301/255* (2013.01); *B22F 2303/40* (2013.01); *B22F 2304/05* (2013.01); *H05K 3/3484* (2013.01)

(58) Field of Classification Search
CPC .... B22F 1/0022; B22F 1/0014; B22F 1/0018; B22F 1/0067; B22F 1/0074; B22F 7/064; B22F 2303/40; B22F 2301/255; B22F 2304/05; B22F 1/0062; B23K 35/3006; B23K 35/025; B23K 1/0008; H05K 3/3484

See application file for complete search history.

(56) References Cited

U.S. PATENT DOCUMENTS

| | | | |
|---|---|---|---|
| 8,641,929 B2 | 2/2014 | Endoh et al. | |
| 9,533,380 B2 * | 1/2017 | Endoh | ................... B22F 1/0018 |
| 2012/0114972 A1 | 5/2012 | Komatsu et al. | |
| 2013/0081759 A1 | 4/2013 | Endoh et al. | |
| 2013/0323529 A1 | 12/2013 | Kurita et al. | |
| 2015/0028085 A1 * | 1/2015 | Endoh | ................... B22F 1/0018 |
| | | | 228/224 |

FOREIGN PATENT DOCUMENTS

| | | | |
|---|---|---|---|
| EP | 2 581 156 A1 | 4/2013 | |
| JP | 2010-153118 A | 7/2010 | |
| JP | 2011-80147 A | 4/2011 | |
| JP | 2011-240406 A | 12/2011 | |
| JP | 4870223 B1 | 2/2012 | |
| JP | 2012-52198 A | 3/2012 | |
| JP | 2012052198 A * | 3/2012 | |
| JP | 2013-4309 A | 1/2013 | |
| WO | 2011/155055 A1 | 12/2011 | |
| WO | WO-2011155055 A1 * | 12/2011 | ............ B22F 1/0018 |
| WO | 2012/070262 A1 | 5/2012 | |
| WO | WO-2013108408 A1 * | 7/2013 | ............ B22F 1/0018 |

OTHER PUBLICATIONS

International Search Report for PCT/JP2014/066916 dated Sep. 11, 2014.
Che et al., "Nanoparticles-aided Silver Front Contact Paste for Crystalline Silicon Solar Cells", J. Material Science: Material Electron (2013), 24, pp. 524-528.
Soichi et al., "Low-Temperature and Low-Pressure Die Bonding Using Thin Ag-Flake and Ag-Particle Pastes for Power Devices", IEEE Transactions on Components, Packaging and Manufacturing Technology, vol. 3, No. 6, Jun. 2013, pp. 923-929.

* cited by examiner

*Primary Examiner* — Anthony J Green
(74) *Attorney, Agent, or Firm* — Bachman & LaPointe, PC

(57) ABSTRACT

A bonding material of a silver paste includes: fine silver particles having an average primary particle diameter of 1 to 50 nanometers, each of the fine silver particles being coated with an organic compound having a carbon number of not greater than 8, such as hexanoic acid; silver particles having an average primary particle diameter of 0.5 to 4 micrometers, each of the silver particles being coated with an organic compound, such as oleic acid; a solvent containing 3 to 7% by weight of an alcohol and 0.3 to 1% by weight of a triol; a dispersant containing 0.5 to 2% by weight of an acid dispersant and 0.01 to 0.1% by weight of phosphate ester dispersant; and 0.01 to 0.1% by weight of a sintering aid, such as diglycolic acid, wherein the content of the fine silver particles is in the range of from 5% by weight to 30% by weight, and the content of the silver particles is in the range of from 60% by weight to 90% by weight, the content of the total of the fine silver particles and the silver particles being not less than 90% by weight.

15 Claims, No Drawings

000

BONDING MATERIAL AND BONDING METHOD USING SAME

TECHNICAL FIELD

The present invention relates generally to a bonding material and a bonding method using the same. More specifically, the invention relates to a bonding material of a silver paste containing fine silver particles, and a method for bonding articles to each other using the same.

BACKGROUND ART

In recent years, it is proposed that a silver paste containing fine silver particles is used as a bonding material to be arranged between articles to be heated for a predetermined period of time while applying pressure between the articles, to sinter silver in the bonding material to bond the articles to each other (see, e.g., Japanese Patent Laid-Open No. 2011-80147).

In order to bond articles to each other by substituting such a bonding material for a lead solder, it is desired that the articles can be bonded (pressureless-bonded) to each other without applying pressure between the articles, as such a case that the articles are bonded to each other by a lead solder. Also in order to prevent silver oxide from being formed in the bonded portion between the articles to deteriorate the bonding strength between the articles, it is desired that the articles can be bonded to each other even in an inert atmosphere, such as a nitrogen atmosphere.

As a bonding material capable of bonding articles to each other in an inert atmosphere even if any pressure is applied between the articles, there is proposed a bonding material wherein a flux component, such as diglycolic acid, is added to a silver paste containing fine silver particles (see, e.g., Japanese Patent Laid-Open No. 2011-240406).

Moreover, if voids exist on the bonded surface when articles are bonded to each other by means of a bonding material, even if the articles are bonded to each other at a desired bonding strength, when a repeated heat cycle (e.g., a heat cycle repeated at −55 to 150° C. 500 times or more) is applied thereto, stress is applied to the voids to cracks in the bonding layer from the voids to deteriorate the reliability of bonding. For that reason, in order to satisfactorily bond the articles to each other by means of the bonding material, it is required to restrain voids from being produced in the bonded portion (to suppress a proportion (void fraction) of area, which is occupied by voids with respect to the area of the bonded surface, to less than 10%), and it is required to suppress the amount of a solvent (a dispersion medium for fine silver particles) causing voids (to increase the content of silver). On the other hand, in order to satisfactorily apply the bonding material by the screen printing using a metal mask, it is required to decrease the viscosity of the bonding material. However, the content of silver in the bonding material is decreased if the viscosity of the bonding material is decreased, and the viscosity of the bonding material is increased if the content of silver in the bonding material is increased, so that the relationship between the viscosity of the bonding material and the content of silver in the bonding material is trade-off.

In general, in order to decrease the viscosity of a bonding material of a silver paste containing fine silver particles, it is known to add a dispersant to the bonding material. As a bonding material which has a high content of silver (a small amount of a solvent to be added) and the viscosity of which can be decreased to a viscosity suitable for printing, there is proposed a bonding material wherein a phosphoric acid dispersant, such as a phosphate ester dispersant, is added to a silver paste containing fine silver particles (see, e.g., Japanese Patent Laid-Open No. 2013-4309).

However, if articles are bonded to each other by means of a bonding material containing a phosphoric acid dispersant, such as a phosphate ester dispersant, it is easy to produce voids in the bonded portion.

DISCLOSURE OF THE INVENTION

It is therefore an object of the present invention to eliminate the aforementioned problems and to provide a bonding material, which can be easily printed on an article to be bonded and which can restrain voids from being produced in a bonded portion in which the article is bonded to another article, and a bonding method using the same.

In order to accomplish the aforementioned and other objects, the inventors have diligently studied and found that it is possible to provide a bonding material, which can be easily printed on an article to be bonded and which can restrain voids from being produced in a bonded portion in which the article is bonded to another article, and a bonding method using the same, if the bonding material of a silver paste comprises: fine silver particles having an average primary particle diameter of 1 to 50 nanometers; silver particles having an average primary particle diameter of 0.5 to 4 micrometers; a solvent; and a dispersant, wherein the content of the fine silver particles is in the range of from 5% by weight to 30% by weight, and the content of the silver particles is in the range of from 60% by weight to 90% by weight, the content of the total of the fine silver particles and the silver particles being not less than 90% by weight. Thus, the inventors have made the present invention.

According to the present invention, there is provided a bonding material of a silver paste comprising: fine silver particles having an average primary particle diameter of 1 to 50 nanometers; silver particles having an average primary particle diameter of 0.5 to 4 micrometers; a solvent; and a dispersant, wherein the content of the fine silver particles is in the range of from 5% by weight to 30% by weight, and the content of the silver particles is in the range of from 60% by weight to 90% by weight, the content of the total of the fine silver particles and the silver particles being not less than 90% by weight.

In this bonding material, the dispersant preferably comprises an acid dispersant and a phosphate ester dispersant. The amount of the phosphate ester dispersant is preferably 0.01 to 0.1% by weight with respect to the silver paste, and the amount of the acid dispersant is preferably 0.5 to 2% by weight with respect to the silver paste. The silver paste preferably contains a sintering aid, such as diglycolic acid, and the amount of the sintering aid is preferably 0.01 to 0.1% by weight with respect to the silver paste. The solvent preferably comprises an alcohol and a triol. Each of the fine silver particles is preferably coated with an organic compound having a carbon number of not greater than 8, such as hexanoic acid. Each of the silver particles is preferably coated with an organic compound, such as oleic acid.

When the bonding material is arranged between articles to be heated to sinter silver therein to bond articles to each other via a silver bonding layer, the percentage of an area occupied by voids is preferably less than 10% with respect to the area of a bonded surface of the silver bonding layer. The bonding material preferably has a viscosity of not greater than 100 Pa·s when the viscosity is measured at 25° C. and 6.4 rpm by means of a rheometer.

According to the present invention, there is provided a bonding method comprising the steps of: arranging the above-described bonding material between articles; and heating the bonding material to sinter silver therein to form a silver bonding layer to bond the articles to each other with the silver bonding layer.

Throughout the specification, the expression "the average primary particle diameter of fine silver particles" means an average value of primary particle diameters of fine silver particles based on a transmission electron microphotograph (TEM image), and the expression "the average primary particle diameter of silver particles" means the 50% particle diameter ($D_{50}$ diameter) of silver particles (the diameter of cumulative 50% by weight of silver particles) measured by the laser diffractometry.

According to the present invention, it is possible to provide a bonding material, which can be easily printed on an article to be bonded and which can restrain voids from being produced in a bonded portion in which the article is bonded to another article, and a bonding method using the same.

BEST MODE FOR CARRYING OUT THE INVENTION

In a preferred embodiment of a bonding material according to the present, the bonding material comprises a silver paste containing: fine silver particles having an average primary particle diameter of 1 to 50 nanometers; silver particles having an average primary particle diameter of 0.5 to 4 micrometers; a solvent; and a dispersant, wherein the content of the fine silver particles is in the range of from 5% by weight to 30% by weight, and the content of the silver particles is in the range of from 60% by weight to 90% by weight, the content of the total of the fine silver particles and the silver particles being not less than 90% by weight.

The average primary particle diameter of the fine silver particles (silver nanoparticles) is in the range of from 1 nanometer to 50 nanometers, preferably from 5 micrometers to 40 nanometers, and more preferably from 10 nanometers to 30 nanometers. Each of the fine silver particles is preferably coated with an organic compound having a carbon number of not greater than 8, such as hexanoic acid or sorbic acid, and more preferably coated with hexanoic acid.

The average primary particle diameter of the silver particles (silver micron-particles) is in the range of from 0.5 micrometers to 4 micrometers, preferably from 0.7 micrometers to 3.5 micrometers, and more preferably from 0.8 micrometers to 3 micrometers. Each of the silver particles is preferably coated with an organic compound, such as oleic acid or stearic acid, and more preferably coated with oleic acid.

The dispersant preferably comprises an acid dispersant and a phosphate ester dispersant). The acid dispersant may be a dispersant containing a carboxyl group or the like, and is preferably a dispersant containing a carboxyl group and having an ether structure. The phosphate ester dispersant may be a dispersant containing a phosphate ester. The amount of the acid dispersant is preferably 0.5 to 2% by weight and more preferably 0.8 to 1.5% by weight, with respect to the silver paste. The amount of the phosphate ester dispersant is preferably 0.01 to 0.1% by weight and more preferably 0.03 to 0.08% by weight, with respect to the silver paste.

The silver paste preferably contains a sintering aid, such as diglycolic acid, as an addition agent. The amount of the sintering aid is preferably 0.01 to 0.1% by weight and more preferably 0.05 to 0.07% by weight, with respect to the silver paste.

The solvent preferably comprises an alcohol and a triol. The alcohol may be 1-octanol, 1-decanol or the like. The amount of the alcohol is preferably 3 to 7% by weight and more preferably 4 to 6% by weight, with respect to the silver paste. The amount of the triol is preferably 0.3 to 1% by weight and more preferably 0.4 to 0.6% by weight, with respect to the silver paste.

When the bonding material is arranged between articles to be heated to sinter silver therein to bond articles to each other via a silver bonding layer, the percentage of an area occupied by voids is preferably less than 10% with respect to the area of a bonded surface of the silver bonding layer.

The bonding material preferably has a viscosity of not greater than 100 Pa·s when the viscosity is measured at 25° C. and 6.4 rpm by means of a rheometer (viscoelasticity measuring apparatus).

In a preferred embodiment of a bonding method according to the present invention, the above-described bonding material is arranged between articles to be heated to sinter silver therein to form a silver bonding layer to bond the articles to each other with the silver bonding layer.

Specifically, the above-described bonding material is applied on at least one of two articles to be arranged between the articles to be heated at 60 to 200° C., preferably at 80 to 170° C., to be dried to form a predried film, and then, heated at 210 to 400° C., preferably at 230 to 300° C., to sinter silver in the silver paste to form a silver bonding layer to bond the articles with the silver bonding layer. Furthermore, when the bonding material is heated, pressure may be applied between the articles although it is not always required to apply pressure. It is possible to bond articles even if the bonding material is heated in the atmosphere, although it is possible to bond articles by heating the bonding material in an inert atmosphere, such as nitrogen atmosphere.

Examples of a bonding material and a bonding method using the same according to the present invention will be described below in detail.

Example 1

First, there was prepared a bonding material of a silver past containing: 9.3% by weight of fine silver particles coated with hexanoic acid and having an average primary particle diameter of 20 nanometers (DP-1 produced by DOWA ELECTRONICS MATERIALS CO., LTD.); 83.8% by weight of silver particles coated with oleic acid and having an average primary particle diameter of 0.8 micrometers (AG2-1C produced by DOWA HIGHTEC CO., LTD.); 0.067% by weight of diglycolic acid (DGA) (dicarboxylic acid) as a sintering aid (addition agent); 1% by weight of an acid dispersant (View Light LCA-25NH produced by Sanyo Chemical Industries, Ltd.) (non-phosphate ester dispersant); 0.08% by weight of a phosphate ester dispersant (SOLPULUS D540 produced by Lubrizol Corporation); and 5.353% by weight of 1-decanol (alcohol) and 0.5% by weight of triol (IPTL-A produced by Nippon Terpene Chemicals, Inc.) serving as a solvent.

The viscosity of this bonding material (silver paste) was obtained by a rheometer (viscoelasticity measuring apparatus) (HAAKE Rheostress 600 produced by Thermo Scientific, Inc., used cone: C35/2°). As a result, the viscosity measured at 25° C. was 202.9 (Pa·s) at 0.6 rpm (2.1 $s^{-1}$), 150.5 (Pa·s) at 1 rpm, 82.92 (Pa·s) at 2 rpm, 37.71 (Pa·s) at 5 rpm, and 30.98 (Pa·s) at 6.4 rpm (20.1 s$^{-1}$). When the viscosity was measured at 25° C., the ratio (Ti value) of the viscosity at 1 rpm to the viscosity at 5 rpm (viscosity at 1 rpm/viscosity at 5 rpm) was 4 (this Ti value will be hereinafter referred to as "Ti1"), and the ratio (Ti value) of the viscosity at 2.1 s$^{-1}$ to the viscosity at 20.1 s$^{-1}$ (viscosity at 2.1 s$^{-1}$/viscosity at 20.1 s$^{-1}$) was 6.5 (this Ti value will be hereinafter referred to as "Ti2"). Thus, the print quality (printability) of the bonding material (silver paste) was good.

Then, there were prepared a copper plate having a size of 10 mm×10 mm×1 mm treated with 10% sulphuric acid after degreased with ethanol, and an Si chip having a size of 3 mm×3 mm×0.3 mm plated with silver.

Then, a metal mask having a thickness of 50 micrometers was arranged on the copper plate, and the above-described bonding material (silver paste) was applied on the copper plate so as to have a size of 3.5 mm×3.5 mm and a thickness of 50 micrometers.

Then, the Si chip was arranged on the bonding material applied on the copper plate, and a load of 0.1 MPa was applied for 10 seconds between the bonding material and the Si chip. Then, a lamp furnace was used in a nitrogen atmosphere to raise temperature at a temperature rising rate of 0.1° C./s from 25° C. to 150° C. to carry out a pre-backing treatment for holding temperature at 150° C. for 30 minutes to dry the silver paste, and then, to raise temperature at a temperature rising rate of 0.1° C./s to 250° C. to carry out a calcination treatment for holding temperature at 250° C. for 60 minutes to sinter silver in the silver paste to form a silver bonding layer to bond the Si chip to the copper plate with the silver bonding layer.

With respect to a bonded article thus obtained, a void fraction on the bonded surface (a percentage of an area occupied by voids with respect to the area of the bonded surface) was calculated from the X-ray photograph thereof. As a result, the void fraction was a low value of 5.1%, and it was good. The shear strength (force applied when the Si chip was peeled off from the copper plate by pushing the Si chip in lateral directions) of the bonded article was measured by a bond tester (Series 400 produced by Dage Corporation). As a result, the shear strength was 11 MPa, which was a high value to a certain degree, and it was nearly good.

Example 2

There was prepared a bonding material of the same silver paste as that in Example 1, except that the amount of the fine silver particles coated with hexanoic acid was 20% by weight and the amount of the silver particles coated with oleic acid was 73% by weight.

The viscosity of this bonding material (silver paste) was obtained by the same method as that in Example 1. As a result, the viscosity measured at 25° C. was 269.5 (Pa·s) at 0.6 rpm (2.1 s$^{-1}$), 187.4 (Pa·s) at 1 rpm, 106.6 (Pa·s) at 2 rpm, 43.37 (Pa·s) at 5 rpm, and 33.7 (Pa·s) at 6.4 rpm (20.1 s$^{-1}$). When the viscosity was measured at 25° C., the ratio (Ti1) of the viscosity at 1 rpm to the viscosity at 5 rpm was 4.1, and the ratio (Ti2) of the viscosity at 2.1 s$^{-1}$ to the viscosity at 20.1 s$^{-1}$ was 8. Thus, the print quality (printability) of the bonding material (silver paste) was good.

The bonding material (silver paste) was used for obtaining a bonded article by the same method as that in Example 1. With respect to this bonded articles, the void fraction on the bonded surface was calculated by the same method as that in Example 1, and the shear strength was measured by the same method as that in Example 1. As a result, the void fraction was a low value of 2.4%, and it was good. The shear strength was a high value of 31.7 MPa, and it was good.

Example 3

There was prepared a bonding material of the same silver paste as that in Example 1, except that the amount of the fine silver particles coated with hexanoic acid was 27.9% by weight and the amount of the silver particles coated with oleic acid was 65.1% by weight.

The viscosity of this bonding material (silver paste) was obtained by the same method as that in Example 1. As a result, the viscosity measured at 25° C. was 547.1 (Pa·s) at 0.6 rpm (2.1 s$^{-1}$), 426 (Pa·s) at 1 rpm, 222 (Pa·s) at 2 rpm, 83.37 (Pa·s) at 5 rpm, and 55.49 (Pa·s) at 6.4 rpm (20.1 s$^{-1}$). When the viscosity was measured at 25° C., the ratio (Ti1) of the viscosity at 1 rpm to the viscosity at 5 rpm was 5.1, and the ratio (Ti2) of the viscosity at 2.1 s$^{-1}$ to the viscosity at 20.1 s$^{-1}$ was 9.9. Thus, the print quality (printability) of the bonding material (silver paste) was good.

The bonding material (silver paste) was used for obtaining a bonded article by the same method as that in Example 1. With respect to this bonded articles, the void fraction on the bonded surface was calculated by the same method as that in Example 1, and the shear strength was measured by the same method as that in Example 1. As a result, voids were hardly observed so that the void fraction was 0%, and it was very good. The shear strength was a high value of 32.6 MPa, and it was good.

Example 4

There was prepared a bonding material of the same silver paste as that in Example 1, except that the amount of the fine silver particles coated with hexanoic acid was 35% by weight and the amount of the silver particles coated with oleic acid was 58% by weight.

The viscosity of this bonding material (silver paste) was obtained by the same method as that in Example 1. As a result, the viscosity measured at 25° C. was 1166 (Pa·s) at 0.6 rpm (2.1 s$^{-1}$), 992.7 (Pa·s) at 1 rpm, 791.6 (Pa·s) at 2 rpm, 65.84 (Pa·s) at 5 rpm, and 51.4 (Pa·s) at 6.4 rpm (20.1 s$^{-1}$). When the viscosity was measured at 25° C., the ratio (Ti1) of the viscosity at 1 rpm to the viscosity at 5 rpm was 15.1, and the ratio (Ti2) of the viscosity at 2.1 s$^{-1}$ to the viscosity at 20.1 s$^{-1}$ was 22.7. Thus, the print quality (printability) of the bonding material (silver paste) was good.

The bonding material (silver paste) was used for obtaining a bonded article by the same method as that in Example 1. With respect to this bonded articles, the void fraction on the bonded surface was calculated by the same method as that in Example 1, and the shear strength was measured by the same method as that in Example 1. As a result, voids were hardly observed so that the void fraction was 0%, and it was very good. The shear strength was a high value of 43.4 MPa, and it was good.

Comparative Example 1

There was prepared a bonding material of the same silver paste as that in Example 1, except that the amount of the fine silver particles coated with hexanoic acid was 42.5% by weight and the amount of the silver particles coated with oleic acid was 50.5% by weight.

The viscosity of this bonding material (silver paste) was attempted to be obtained by the same method as that in Example 1. However, the viscosity was too high to be measured. Thus, the print quality (printability) of the bonding material (silver paste) was very bad.

The bonding material (silver paste) was used for obtaining a bonded article by the same method as that in Example 1. With respect to this bonded articles, the void fraction on the bonded surface was calculated by the same method as that in Example 1, and the shear strength was measured by the same method as that in Example 1. As a result, voids were hardly observed so that the void fraction was 0%, and it was very good. The shear strength was a high value of 21.9 MPa, and it was good.

Comparative Example 2

There was prepared a bonding material of the same silver paste as that in Example 1, except that the amount of the fine silver particles coated with hexanoic acid was 50% by weight and the amount of the silver particles coated with oleic acid was 43% by weight.

The viscosity of this bonding material (silver paste) was attempted to be obtained by the same method as that in Example 1. However, the viscosity was too high to be measured. Thus, the print quality (printability) of the bonding material (silver paste) was very bad.

The bonding material (silver paste) was used for obtaining a bonded article by the same method as that in Example 1. With respect to this bonded articles, the void fraction on the bonded surface was calculated by the same method as that in Example 1, and the shear strength was measured by the same method as that in Example 1. As a result, the void fraction was a high value of 11%, and it was not good. The shear strength was a high value of 33.3 MPa, and it was good.

Example 5

There was prepared a bonding material of the same silver paste as that in Example 2, except that 73% by weight of silver particles coated with stearic acid and having an average primary particle diameter of 3 micrometers (AG5-7F produced by DOWA HIGHTEC CO., LTD.) was substituted for the silver particles coated with oleic acid.

The viscosity of this bonding material (silver paste) was obtained by the same method as that in Example 1. As a result, the viscosity measured at 25° C. was 85.91 (Pa·s) at 0.6 rpm (2.1 s$^{-1}$), 58.41 (Pa·s) at 1 rpm, 33.6 (Pa·s) at 2 rpm, 17.69 (Pa·s) at 5 rpm, and 15.23 (Pa·s) at 6.4 rpm (20.1 s$^{-1}$). When the viscosity was measured at 25° C., the ratio (Ti1) of the viscosity at 1 rpm to the viscosity at 5 rpm was 3.3, and the ratio (Ti2) of the viscosity at 2.1 s$^{-1}$ to the viscosity at 20.1 s$^{-1}$ was 5.6. Thus, the print quality (printability) of the bonding material (silver paste) was good.

The bonding material (silver paste) was used for obtaining a bonded article by the same method as that in Example 1. With respect to this bonded articles, the void fraction on the bonded surface was calculated by the same method as that in Example 1, and the shear strength was measured by the same method as that in Example 1. As a result, the void fraction was 6.3% which was a low value to a certain degree, and it was nearly good. The shear strength was a high value of 29 MPa, and it was good.

Comparative Example 3

There was prepared a bonding material of the same silver paste as that in Example 2, except that 20% by weight of fine silver particles coated with sorbic acid and having an average primary particle diameter of 60 nanometers (DP-2 produced by DOWA ELECTRONICS MATERIALS CO., LTD.) was substituted for the fine silver particles coated with hexanoic acid.

The viscosity of this bonding material (silver paste) was obtained by the same method as that in Example 1. As a result, the viscosity measured at 25° C. was 132.6 (Pa·s) at 0.6 rpm (2.1 s$^{-1}$), 89.95 (Pa·s) at 1 rpm, 47.35 (Pa·s) at 2 rpm, 20.97 (Pa·s) at 5 rpm, and 16.95 (Pa·s) at 6.4 rpm (20.1 s$^{-1}$). When the viscosity was measured at 25° C., the ratio (Ti1) of the viscosity at 1 rpm to the viscosity at 5 rpm was 4.3, and the ratio (Ti2) of the viscosity at 2.1 s$^{-1}$ to the viscosity at 20.1 s$^{-1}$ was 7.8. Thus, the print quality (printability) of the bonding material (silver paste) was good.

The bonding material (silver paste) was used for obtaining a bonded article by the same method as that in Example 1. With respect to this bonded articles, the void fraction on the bonded surface was calculated by the same method as that in Example 1, and the shear strength was measured by the same method as that in Example 1. As a result, the void fraction was a high value of 20.7%, and it was not good. The shear strength was a high value of 20.7 MPa, and it was good.

Example 6

There was prepared a bonding material of the same silver paste as that in Example 2, except that the amount of the phosphate ester dispersant was 0.04% by weight.

The viscosity of this bonding material (silver paste) was obtained by the same method as that in Example 1. As a result, the viscosity measured at 25° C. was 230.6 (Pa·s) at 0.6 rpm (2.1 s$^{-1}$), 372.8 (Pa·s) at 1 rpm, 255.3 (Pa·s) at 2 rpm, 114.2 (Pa·s) at 5 rpm, and 57.31 (Pa·s) at 6.4 rpm (20.1 s$^{-1}$). When the viscosity was measured at 25° C., the ratio (Ti1) of the viscosity at 1 rpm to the viscosity at 5 rpm was 3.3, and the ratio (Ti2) of the viscosity at 2.1 s$^{-1}$ to the viscosity at 20.1 s$^{-1}$ was 4.0. Thus, the print quality (printability) of the bonding material (silver paste) was good.

The bonding material (silver paste) was used for obtaining a bonded article by the same method as that in Example 1. With respect to this bonded articles, the void fraction on the bonded surface was calculated by the same method as that in Example 1, and the shear strength was measured by the same method as that in Example 1. As a result, voids were hardly observed so that the void fraction was 0%, and it was very good. The shear strength was a high value of 34.1 MPa, and it was good.

Comparative Example 4

There was prepared a bonding material of the same silver paste as that in Example 2, except that the amount of the phosphate ester dispersant was 1% by weight and that the acid dispersant was not added.

The viscosity of this bonding material (silver paste) was obtained by the same method as that in Example 1. As a result, the viscosity measured at 25° C. was 15.58 (Pa·s) at 0.6 rpm (2.1 s$^{-1}$), 10.85 (Pa·s) at 1 rpm, 6.408 (Pa·s) at 2 rpm, 3.405 (Pa·s) at 5 rpm, and 2.907 (Pa·s) at 6.4 rpm (20.1 s$^{-1}$). When the viscosity was measured at 25° C., the ratio (Ti1) of the viscosity at 1 rpm to the viscosity at 5 rpm was 3.2, and the ratio (Ti2) of the viscosity at 2.1 s$^{-1}$ to the viscosity at 20.1 s$^{-1}$ was 5.4. Thus, the print quality (printability) of the bonding material (silver paste) was good.

The bonding material (silver paste) was used for obtaining a bonded article by the same method as that in Example 1. With respect to this bonded articles, the void fraction on the bonded surface was calculated by the same method as that in Example 1, and the shear strength was measured by the same method as that in Example 1. As a result, the void fraction was a high value of 25.8%, and it was not good. The shear strength was a high value of 26.3 MPa, and it was good.

Example 7

There was prepared a bonding material of the same silver paste as that in Example 2, except that 5.353% by weight of 1-octanol was substituted for 1-decanol as the alcohol solvent.

The viscosity of this bonding material (silver paste) was obtained by the same method as that in Example 1. As a result, the viscosity measured at 25° C. was 303.7 (Pa·s) at 0.6 rpm (2.1 $s^{-1}$), 273.2 (Pa·s) at 1 rpm, 156 (Pa·s) at 2 rpm, 67.34 (Pa·s) at 5 rpm, and 49.21 (Pa·s) at 6.4 rpm (20.1 $s^{-1}$). When the viscosity was measured at 25° C., the ratio (Ti1) of the viscosity at 1 rpm to the viscosity at 5 rpm was 4.1, and the ratio (Ti2) of the viscosity at 2.1 $s^{-1}$ to the viscosity at 20.1 $s^{-1}$ was 6.2. Thus, the print quality (printability) of the bonding material (silver paste) was good.

The bonding material (silver paste) was used for obtaining a bonded article by the same method as that in Example 1. With respect to this bonded articles, the void fraction on the bonded surface was calculated by the same method as that in Example 1, and the shear strength was measured by the same method as that in Example 1. As a result, voids were hardly observed so that the void fraction was 0%, and it was very good. The shear strength was a high value of 28.4 MPa, and it was good.

Example 8

There was prepared a bonding material of the same silver paste as that in Example 2, except that 2.6765% by weight of 1-decanol and 2.6765% by weight of a terpene-based alcohol (TOE-100 produced by Nippon Terpene Chemicals, Inc. (terpene ether derived from gum terpene oil and ethylene glycol)) were substituted for 5.353% by weight of 1-decanol serving as the alcohol solvent.

The viscosity of this bonding material (silver paste) was obtained by the same method as that in Example 1. As a result, the viscosity measured at 25° C. was 377 (Pa·s) at 0.6 rpm (2.1 $s^{-1}$), 266.9 (Pa·s) at 1 rpm, 146 (Pa·s) at 2 rpm, 63.19 (Pa·s) at 5 rpm, and 50.55 (Pa·s) at 6.4 rpm (20.1 $s^{-1}$). When the viscosity was measured at 25° C., the ratio (Ti1) of the viscosity at 1 rpm to the viscosity at 5 rpm was 4.2, and the ratio (Ti2) of the viscosity at 2.1 $s^{-1}$ to the viscosity at 20.1 $s^{-1}$ was 7.5. Thus, the print quality (printability) of the bonding material (silver paste) was good.

The bonding material (silver paste) was used for obtaining a bonded article by the same method as that in Example 1. With respect to this bonded articles, the void fraction on the bonded surface was calculated by the same method as that in Example 1, and the shear strength was measured by the same method as that in Example 1. As a result, voids were hardly observed so that the void fraction was 0%, and it was very good. The shear strength was a high value of 49.7 MPa, and it was good.

Example 9

There was prepared a bonding material of the same silver paste as that in Example 2, except that the amount of the fine silver particles coated with hexanoic acid was 20.108% by weight and the amount of the silver particles coated with oleic acid was 73.392% by weight, the amount of the diglycolic acid (DGA) (dicarboxylic acid) serving as the sintering aid (addition agent) being 0.062% by weight, the amount of the acid dispersant being 0.929% by weight, the amount of the phosphate ester dispersant being 0.074% by weight, the amount of the triol serving as the solvent being 0.464% by weight, and that 2.485% by weight of 1-decanol and 2.485% by weight of a terpene-based alcohol (TOE-100 produced by Nippon Terpene Chemicals, Inc.) were substituted for 5.353% by weight of 1-decanol serving as the alcohol solvent.

The viscosity of this bonding material (silver paste) was obtained by the same method as that in Example 1. As a result, the viscosity measured at 25° C. was 602.4 (Pa·s) at 0.6 rpm (2.1 $s^{-1}$), 497.1 (Pa·s) at 1 rpm, 232.6 (Pa·s) at 2 rpm, 79.26 (Pa·s) at 5 rpm, and 56.78 (Pa·s) at 6.4 rpm (20.1 $s^{-1}$). When the viscosity was measured at 25° C., the ratio (Ti1) of the viscosity at 1 rpm to the viscosity at 5 rpm was 6.3, and the ratio (Ti2) of the viscosity at 2.1 $s^{-1}$ to the viscosity at 20.1 $s^{-1}$ was 10.6. Thus, the print quality (printability) of the bonding material (silver paste) was good.

The bonding material (silver paste) was used for obtaining a bonded article by the same method as that in Example 1. With respect to this bonded articles, the void fraction on the bonded surface was calculated by the same method as that in Example 1, and the shear strength was measured by the same method as that in Example 1. As a result, voids were hardly observed so that the void fraction was 0%, and it was very good. The shear strength was a high value of 78.1 MPa, and it was good.

Example 10

There was prepared a bonding material of the same silver paste as that in Example 2, except that the amount of the fine silver particles coated with hexanoic acid was 20.215% by weight and the amount of the silver particles coated with oleic acid was 73.785% by weight, the amount of the diglycolic acid (DGA) (dicarboxylic acid) serving as the sintering aid (addition agent) being 0.057% by weight, the amount of the acid dispersant being 0.857% by weight, the amount of the phosphate ester dispersant being 0.069% by weight, the amount of the triol serving as the solvent being 0.429% by weight, and that 2.295% by weight of 1-decanol and 2.295% by weight of a terpene-based alcohol (TOE-100 produced by Nippon Terpene Chemicals, Inc.) were substituted for 5.353% by weight of 1-decanol serving as the alcohol solvent.

The viscosity of this bonding material (silver paste) was obtained by the same method as that in Example 1. As a result, the viscosity measured at 25° C. was 794 (Pa·s) at 0.6 rpm (2.1 $s^{-1}$), 651.7 (Pa·s) at 1 rpm, 350.7 (Pa·s) at 2 rpm, 98.11 (Pa·s) at 5 rpm, and 50.12 (Pa·s) at 6.4 rpm (20.1 $s^{-1}$). When the viscosity was measured at 25° C., the ratio (Ti1) of the viscosity at 1 rpm to the viscosity at 5 rpm was 6.6, and the ratio (Ti2) of the viscosity at 2.1 $s^{-1}$ to the viscosity at 20.1 $s^{-1}$ was 15.8. Thus, the print quality (printability) of the bonding material (silver paste) was good.

The bonding material (silver paste) was used for obtaining a bonded article by the same method as that in Example 1. With respect to this bonded articles, the void fraction on the bonded surface was calculated by the same method as that in Example 1, and the shear strength was measured by the same method as that in Example 1. As a result, voids were hardly observed so that the void fraction was 0%, and it was very good. The shear strength was a high value of 26.6 MPa, and it was good.

The producing conditions and characteristics of the bonding materials produced in these examples and comparative examples are shown in Tables 1-4. In Table 4, "○" is shown if the viscosity and printability of the bonding material and the void fraction on the bonded surface thereof are good, respectively, and "x" is shown if they are not good.

TABLE 1

|  | Fine Silver Particles (wt %) | | Silver Particles (wt %) | |
|---|---|---|---|---|
|  | Particle Diameter 20 nm | Particle Diameter 60 nm | Particle Diameter 0.8 μm | Particle Diameter 3 μm |
| Ex. 1 | 9.3 | — | 88.7 | — |
| Ex. 2 | 20 | — | 73 | — |
| Ex. 3 | 27.9 | — | 65.1 | — |
| Ex. 4 | 35 | — | 58 | — |
| Ex. 5 | 20 | — | — | 73 |
| Ex. 6 | 20 | — | 73 | — |
| Ex. 7 | 20 | — | 73 | — |
| Ex. 8 | 20 | — | 73 | — |
| Ex. 9 | 20.108 | — | 73.392 | — |
| Ex. 10 | 20.215 | — | 73.785 | — |
| Comp. 1 | 42.5 | — | 50.5 | — |
| Comp. 2 | 50 | — | 43 | — |
| Comp. 3 | — | 20 | 73 | — |
| Comp. 4 | 20 | — | 73 | — |

TABLE 2

|  | Sintering Aid | Dispersant (wt %) | | Solvent (wt %) | | | |
|---|---|---|---|---|---|---|---|
|  | DGA (wt %) | Acid | Phosphate Ester | Triol | Alcohol | | |
|  | | | | | 1-decanol | 1-octanol | TOE-100 |
| Ex. 1 | 0.067 | 1 | 0.08 | 0.5 | 5.353 | — | — |
| Ex. 2 | 0.067 | 1 | 0.08 | 0.5 | 5.353 | — | — |
| Ex. 3 | 0.067 | 1 | 0.08 | 0.5 | 5.353 | — | — |
| Ex. 4 | 0.067 | 1 | 0.08 | 0.5 | 5.353 | — | — |
| Ex. 5 | 0.067 | 1 | 0.08 | 0.5 | 5.353 | — | — |
| Ex. 6 | 0.067 | 1 | 0.04 | 0.5 | 5.393 | — | — |
| Ex. 7 | 0.067 | 1 | 0.08 | 0.5 | — | 5.353 | — |
| Ex. 8 | 0.067 | 1 | 0.08 | 0.5 | 2.6765 | — | 2.6765 |
| Ex. 9 | 0.062 | 0.929 | 0.074 | 0.464 | 2.485 | — | 2.485 |
| Ex. 10 | 0.057 | 0.857 | 0.069 | 0.429 | 2.295 | — | 2.295 |
| Comp. 1 | 0.067 | 1 | 0.08 | 0.5 | 5.353 | — | — |
| Comp. 2 | 0.067 | 1 | 0.08 | 0.5 | 5.353 | — | — |
| Comp. 3 | 0.067 | 1 | 0.08 | 0.5 | 5.353 | — | — |
| Comp. 4 | 0.067 | — | 1 | 0.5 | 5.433 | — | — |

TABLE 3

|  | Viscosity (Pa · s) | | | | | Ti Value | |
|---|---|---|---|---|---|---|---|
|  | 0.6 rpm | 1 rpm | 2 rpm | 5 rpm | 6.4 rpm | Ti1 | Ti2 |
| Ex. 1 | 202.9 | 150.5 | 82.92 | 37.61 | 30.98 | 4 | 6.5 |
| Ex. 2 | 269.5 | 187.4 | 106.2 | 45.37 | 33.7 | 4.1 | 8 |
| Ex. 3 | 547.1 | 426 | 222 | 83.37 | 55.49 | 5.1 | 9.9 |
| Ex. 4 | 1166 | 992.7 | 791.6 | 65.84 | 51.4 | 15.1 | 22.7 |
| Ex. 5 | 85.91 | 58.41 | 33.6 | 17.69 | 15.23 | 3.3 | 5.6 |
| Ex. 6 | 230.6 | 372.8 | 255.3 | 114.2 | 57.31 | 3.3 | 4.0 |
| Ex. 7 | 303.7 | 273.2 | 156 | 67.34 | 49.21 | 4.1 | 6.2 |
| Ex. 8 | 377 | 266.9 | 146 | 63.19 | 50.55 | 4.2 | 7.5 |
| Ex. 9 | 602.4 | 497.1 | 232.6 | 79.26 | 56.78 | 6.3 | 10.6 |
| Ex. 10 | 794 | 651.7 | 350.7 | 98.11 | 50.12 | 6.6 | 15.8 |

TABLE 3-continued

|  | Viscosity (Pa · s) | | | | | Ti Value | |
|---|---|---|---|---|---|---|---|
|  | 0.6 rpm | 1 rpm | 2 rpm | 5 rpm | 6.4 rpm | Ti1 | Ti2 |
| Comp. 1 | unmeasurable | unmeasurable | unmeasurable | unmeasurable | unmeasurable | — | — |
| Comp. 2 | unmeasurable | unmeasurable | unmeasurable | unmeasurable | unmeasurable | — | — |
| Comp. 3 | 132.6 | 89.95 | 47.35 | 20.97 | 16.95 | 4.3 | 7.8 |
| Comp. 4 | 15.58 | 10.85 | 6.408 | 3.405 | 2.907 | 3.2 | 5.4 |

TABLE 4

|  | Void Fraction (%) | Shear Strength (MPa) | Viscosity | Void | Printability |
|---|---|---|---|---|---|
| Ex. 1 | 5.1 | 11 | ○ | ○ | ○ |
| Ex. 2 | 2.4 | 31.7 | ○ | ○ | ○ |
| Ex. 3 | 0 | 32.6 | ○ | ○ | ○ |
| Ex. 4 | 0 | 43.4 | ○ | ○ | ○ |
| Ex. 5 | 6.3 | 29 | ○ | ○ | ○ |
| Ex. 6 | 0 | 34.1 | ○ | ○ | ○ |
| Ex. 7 | 0 | 28.4 | ○ | ○ | ○ |
| Ex. 8 | 0 | 49.7 | ○ | ○ | ○ |
| Ex. 9 | 0 | 78.1 | ○ | ○ | ○ |
| Ex. 10 | 0 | 26.6 | ○ | ○ | ○ |
| Comp. 1 | 0 | 21.9 | x | ○ | x |
| Comp. 2 | 11 | 33.3 | x | x | x |
| Comp. 3 | 20.7 | 14.1 | ○ | x | ○ |
| Comp. 4 | 25.8 | 26.3 | ○ | x | ○ |

The invention claimed is:

1. A bonding material of a silver paste comprising:
   fine silver particles having an average primary particle diameter of 1 to 50 nanometers;
   silver particles having an average primary particle diameter of 0.5 to 4 micrometers;
   a solvent;
   an acid dispersant; and
   a phosphate ester dispersant,
   wherein the content of the fine silver particles is in the range of from 5% by weight to 30% by weight, and the content of the silver particles is in the range of from 60% by weight to 90% by weight, the content of the total of the fine silver particles and the silver particles being not less than 90% by weight.

2. A bonding agent as set forth in claim 1, wherein the amount of said phosphate ester dispersant is 0.01 to 0.1% by weight with respect to said silver paste.

3. A boding agent as set forth in claim 1, wherein the amount of said acid dispersant is 0.5 to 2% by weight with respect to said silver paste.

4. A bonding material as set forth in claim 1, wherein said silver paste contains a sintering aid.

5. A bonding material as set forth in claim 4, wherein said sintering aid is diglycolic acid.

6. A bonding material as set forth in claim 4, wherein the amount of said sintering aid is 0.01 to 0.1% by weight with respect to said silver paste.

7. A bonding material as set forth in claim 1, wherein said solvent comprises 1-octanol or 1-decanol, and a triol.

8. A bonding material as set forth in claim 1, wherein each of said fine silver particles is coated with an organic compound having a carbon number of not greater than 8.

9. A bonding material as set forth in claim 8, wherein said organic compound coating said fine silver particles is hexanoic acid.

10. A bonding material as set forth in claim 1, wherein each of said silver particles is coated with an organic compound.

11. A bonding material as set forth in claim 10, wherein said organic compound coating said silver particles is oleic acid.

12. A bonding material as set forth in claim 1, wherein the percentage of an area occupied by voids is less than 10% with respect to the area of a bonded surface of a silver bonding layer when the bonding material arranged between articles is heated to sinter silver therein to bond articles to each other via the silver bonding layer.

13. A bonding material as set forth in claim 1, wherein said bonding material has a viscosity of not greater than 100 Pa's when the viscosity is measured at 25° C. and 6.4 rpm by means of a rheometer.

14. A bonding material as set forth in claim 1, wherein said acid dispersant is a dispersant containing a carboxyl group and having an ether structure.

15. A bonding method comprising the steps of:
arranging a bonding material, as set forth in claim 1, between articles; and
heating the bonding material to sinter silver therein to form a silver bonding layer to bond said articles to each other with the silver bonding layer.

* * * * *